(12) United States Patent
Li et al.

(10) Patent No.: US 11,169,498 B2
(45) Date of Patent: Nov. 9, 2021

(54) SYSTEM AND METHODS FOR A REAL-TIME POWER PERFORMANCE TRACKER

(71) Applicant: Verdigris Technologies, Inc., Mountain View, CA (US)

(72) Inventors: Daniela Li, Mountain View, CA (US); Michael Roberts, Mountain View, CA (US); William Chan, Mountain View, CA (US); Andrew Jo, Mountain View, CA (US)

(73) Assignee: VERDIGRIS TECHNOLOGIES, INC., Mountain View, CA (US)

( * ) Notice: Subject to any disclaimer, the term of this patent is extended or adjusted under 35 U.S.C. 154(b) by 446 days.

(21) Appl. No.: 16/100,095

(22) Filed: Aug. 9, 2018

(65) Prior Publication Data

US 2020/0348641 A1    Nov. 5, 2020

Related U.S. Application Data

(60) Provisional application No. 62/543,190, filed on Aug. 9, 2017.

(51) Int. Cl.
*G05B 19/042*  (2006.01)
*G01R 21/133*  (2006.01)
*G06N 20/00*  (2019.01)

(52) U.S. Cl.
CPC ....... *G05B 19/0428* (2013.01); *G01R 21/133* (2013.01); *G06N 20/00* (2019.01); *G05B 2219/2639* (2013.01)

(58) Field of Classification Search
CPC .................................................... G06N 20/00

USPC ......................................................... 700/291
See application file for complete search history.

(56) References Cited

U.S. PATENT DOCUMENTS

| | | | |
|---|---|---|---|
| 10,416,202 B1* | 9/2019 | Contario | G01R 19/145 |
| 2013/0345884 A1* | 12/2013 | Forbes, Jr. | H02J 13/00028 700/286 |
| 2014/0018969 A1* | 1/2014 | Forbes, Jr. | H02J 13/00034 700/295 |
| 2014/0039703 A1* | 2/2014 | Forbes, Jr. | H04L 67/10 700/286 |
| 2014/0277788 A1* | 9/2014 | Forbes, Jr. | G06Q 50/06 700/286 |
| 2014/0337107 A1* | 11/2014 | Foster | G06Q 10/06395 705/7.41 |

(Continued)

*Primary Examiner* — Md Azad
(74) *Attorney, Agent, or Firm* — Procopio, Cory, Hargreaves & Savitch LLP

(57) ABSTRACT

A building management system including a local power system that delivers power to devices at a location, a data collector system coupled to the local power system, to monitor aggregate power used at a location, including at least one circuit based sensor configured to collect power usage data, each of the at least one sensors being clamped onto a circuit basis, and a data transmitter coupled to the at least one sensor and communicating the collected power usage data over a network to a cloud analyzer system, a tracker application configured to provide real-time reporting, alerts, and control via the network, and to be executed by a processor in an operating system (OS), in a native or virtual environment, wherein the tracker interacts with an analysis engine to map out energy use inside of a building on an individual circuit basis.

19 Claims, 9 Drawing Sheets

(56) References Cited

U.S. PATENT DOCUMENTS

2015/0051749 A1* 2/2015 Hancock ................ G06Q 50/06
  700/295
2019/0332073 A1* 10/2019 Nasle ................ G06Q 30/0206

* cited by examiner

SYSTEM AND METHODS FOR A REAL-TIME POWER PERFORMANCE TRACKER

CROSS-REFERENCE TO RELATED APPLICATIONS

This application claims benefit of priority from Provisional U.S. Patent application Ser. No. 62/543,190, filed Aug. 9, 2017, the contents of which are incorporated by reference.

BACKGROUND

Field

The present disclosure relates to power performance, and more specifically, to systems and methods for real-time power tracking.

Related Art

In related art implementations, building management systems are typically custom designed proprietary monitoring systems for commercial buildings that set off alarms when there is a malfunction of a critical device. These related art building management systems rely on facilities managers and engineers to configure systems and study power performance metrics to calibrate power usage that keeps buildings running 24 hours a day. Some building management systems allow facilities managers and engineers to remotely manage specific settings of critical devices.

In related art systems, electric metering may be used to determine how much electricity a consumer is using. In older related art systems, metering was typically accomplished through the use of an electricity meter attached to a power line between a building (home, business, or otherwise) and the electric company. However, such related art systems often could only provide information about total energy usage for the entire building and could not provide information about energy consumption associated with specific circuits or devices within the building.

Related art smart metering systems were developed to allow analysis of individual circuits within a building by connecting a sensor to each circuit, often at the circuit breaker box. However, these related art systems may involve either disconnecting power to the entire box resulting in lost work time or connecting a sensor to the energized power lines, which can be dangerous.

Some buildings include a physical infrastructure of wires for power delivery and communication networks (e.g., copper, CAT5 (i.e., category 5 cable), POTS (i.e., plain old telephone service) telephone systems, Ethernet, etc.). In related art systems, intelligent devices may be designed to communicate information based on a communication protocol or transmission medium to specific devices or compatible systems. However, related art building management systems are not compatible with different types of intelligent devices and traditional devices that are not designed to communicate information.

SUMMARY

In example implementations, a building's power performance is monitored in real-time to provide building managers or home owners with accurate in-depth reporting of the building's power performance.

Some aspects of the present application may include a building management system including a local power system that delivers power to devices at a location, a data collector system coupled to the local power system, to monitor aggregate power used at a location, including at least one circuit based sensor configured to collect power usage data, each of the at least one sensors being clamped onto a circuit basis, and a data transmitter coupled to the at least one sensor and communicating the collected power usage data over a network to a cloud analyzer system, a tracker application configured to provide real-time reporting, alerts, and control via the network, and to be executed by a processor in an operating system (OS), in a native or virtual environment, wherein the tracker interacts with an analysis engine to map out energy use inside of a building on an individual circuit basis.

Further aspects of the present application may include a method of managing power in a local power system. The method includes receiving, by an energy management system, energy usage data collected from a plurality of sensors attached to individual circuits of the local power system, generating an individual circuit model for each individual circuit associated with each of the plurality of sensors based on the received energy usage data, monitoring an incoming data stream representative of energy usage data collected from the plurality of sensors, and implementing, by the energy management system, power management controls on one or more of the individual circuits based on the generated individual circuit model and the monitored incoming data stream.

DETAILED DESCRIPTION

Figure 1:
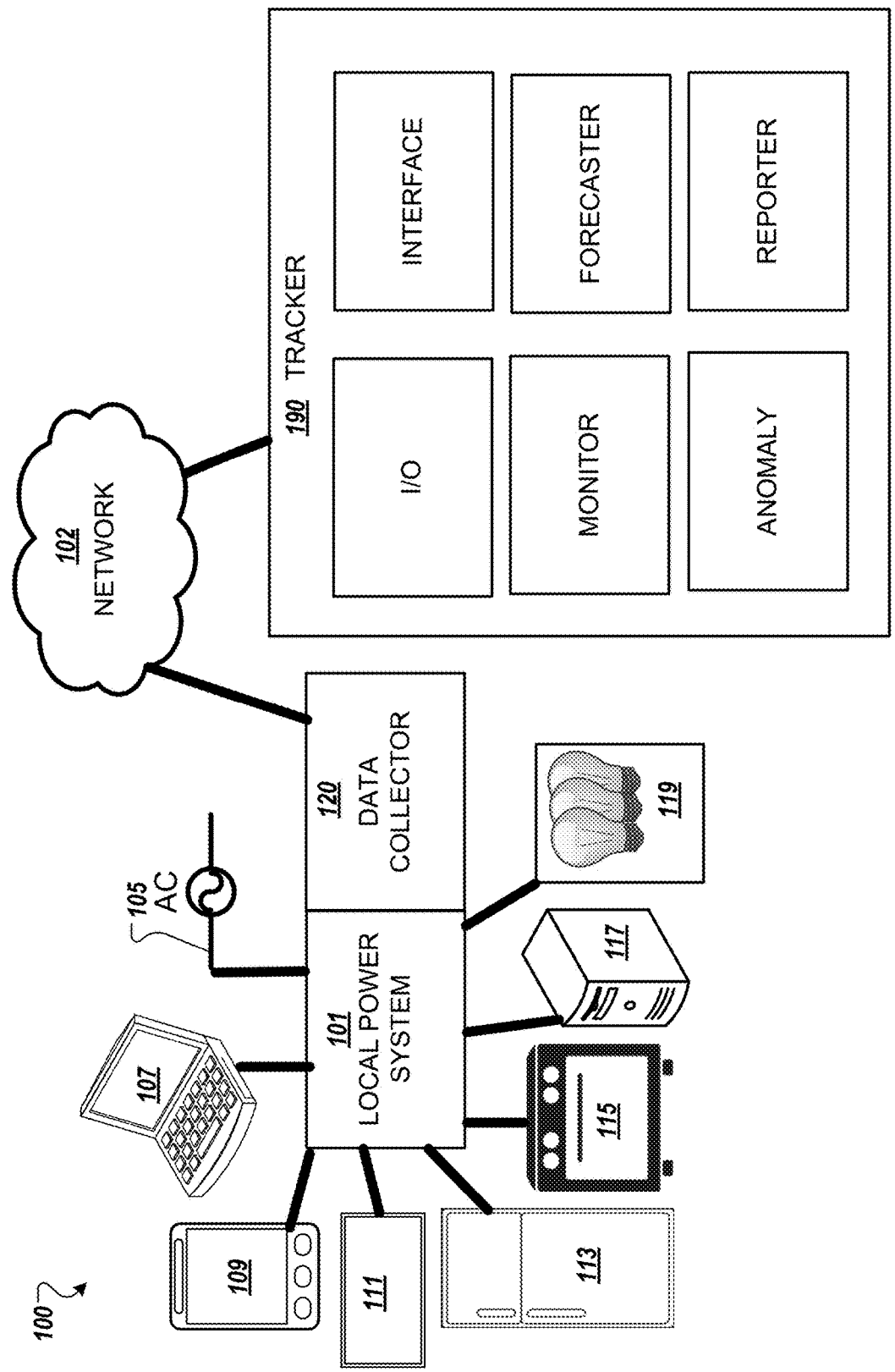
FIG. 1 illustrates an example diagram of a system, in accordance with an example implementation.

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application. Selection can be conducted by a user through a user interface or other input means, or can be implemented through a desired algorithm. Example implementations as described herein can be utilized either singularly or in combination and the functionality of the example implementations can be implemented through any means according to the desired implementations.

Methods and systems described herein may provide a remote real-time tracking of device energy usage based on data collected via a local power system. The real-time tracking can provide energy usage forecasts and alerts to avoid peak energy surcharges. Instead of demand response, the methods and systems described herein may include proactive Automated Demand Management (ADM) aspects. In an example implementation, a method may include real-time forecasting, optimization, and data unification to manage your energy peaks—a step above responding. It brings the power of artificial intelligence to control the building.

Example implementations may also include tracking the building's energy usage to provide insights and control commands to save money by making proactive decisions to adjust energy usage. Forecasted control command may reduce device shut downs. For example, throttling a single exhaust fan can reduce the building's power demand by kWs peak throughout a month. In another example, the system may selectively throttle HVAC equipment based on intelligent forecast-driven pre-cooling.

For example, an energy tracker may include a mobile user interface for building managers or home owners to track energy usage and be alerted to peak or abnormal energy usage. A tracker application provides an easily accessible touch point tool, a rules engine that lets users set alarms with notifications, such as anomalies or performance failures that can be responded to quickly. The tracker application may generate warnings to building managers about high energy demand forecasts that can trigger automated controls or allow the user to force an override to allow peak usage to occur. The application also warns operators if an electrical signature suggests an electrical appliance requires preventative maintenance.

Additionally, the application may track instances of oddly high electrical consumption in just one part of the building. The tracker application can set thresholds for alerts and interact with an AI (i.e., artificial intelligence) based analysis engine to create rules based on statistical analysis that the user has not thought to configure. For example, a user can set alerts so that the lighting does not exceed x amount of dollars or x amount of carbon during daylight.

Methods and systems described herein may detect and curtail demand events for a building to reduce peak usages during a billing cycle and avoiding demand based penalties. For example, the system can cycle demand based on a set of minutes (e.g., 15-minute) per demand period to reduce demand during a billing cycle. Unlike traditional ADR (i.e., automated demand response), methods and systems described herein create persistent demand reduction across an entire month that demonstrates kWs of average curtailment. AI technology continuously monitors the building to proactively manage demand, instead of just responding to a utility signal. By using dynamic equipment cycling, methods and systems described herein achieve reductions in power cost without noticeable occupant impact.

The system is automated and develops response strategies based on machine-learning at times that are convenient to the occupants of the building. Interfaces and mobile applications are provided for building managers to pre-configure settings, approve or override response strategies, and access real-time detailed performance and forecasting data.

FIG. 1 illustrates an example diagram of a building management system 100, in accordance with an example implementation. The system 100 includes a local power system 101 that delivers power to devices 105-119 at a location. For example, the local power system 101 may be part of a residential or commercial building and may be a pre-existing power distribution network with devices connected via sockets (e.g., heating, ventilation and air conditioning (HVAC) 105, laptops or personal computers 107, tablets or mobile computing devices 109, personal entertainment devices such as televisions 111, refrigerators 113, appliances 115, computing devices 117, lights 119, garage door openers, sprinkler systems, etc.) and hard wired devices (e.g., HVAC 105, security systems, appliances 115, lights 119, sprinkler systems, etc.).

Data collector system 120 may be coupled to the local power system 101. The data collector system 120 can be attached to local power system 101 to monitor aggregate power used by a location (e.g., commercial, industrial, or residential building). In an example implementation, circuit based sensors can collect power usage data at a central location, for example, a distribution board (e.g., panelboard, breaker panel, electric panel, etc.). For example, circuit based sensors can be used at an electric panel, where a single sensor is clamped onto each circuit, and the sensors are daisy-chained together, with a data transmitter to connect to a cloud analyzer system. Circuit based sensors can be used for super-high-frequency disaggregation (e.g., 8 kilohertz).

The data collector system 120 may collect thousands of data points per second, perform on-site pre-processing, and the data is transmitted via a network 102 to a cloud-based analytics engine. The data collector system 120 can include a data transmitter to connect to LAN and WAN accessible service via the network 102 through a connection with a wireless carrier system (e.g., through a global system for mobile communications (GSM), code division multiple access (CDMA), wideband code division multiple access (WCDMA), time division multiple access (TDMA), universal mobile telecommunications system (UMTS), long term evolution (LTE), worldwide interoperability for microwave access (WiMAX) or other wireless communication protocol connection).

A tracker 190 can provide real-time reporting, alerts, and control via the network 102. The tracker 190 can be an application executed by an operating system (OS) (not shown), in a native or virtual environment. One or more applications can be deployed that include logic unit, application programming interface (API) unit, input unit, and output unit.

For example, the tracker 190 can be a cloud service or web-based portal that notifies a user via electronic communication of a building's power performance. According to an example implementation, sensors attached to a local power system can sample power usage information and detect characteristics from each device that connects to the local power system. For example, a frequency of the power draw signal can be used to categorize each device type.

The tracker 190 can include an input/output (I/O) for receiving collected data that is analyzed, an interface for receiving user configurations and providing reports. The tracker allows the user to monitor a device's real-time performance, as well as forecasted performance via graphical reports. The tracker can also report detected anomalies in devices or building's power usage. For example, the tracker 190 may provide real-time power demand reports with forecasted power demands that are accessible by mobile devices via the network 102.

The tracker 190 may interact with an analysis engine that maps out energy use inside of a building on a system-by-system, appliance-by-appliance level, using a minimal number of sensors located at central collection points. Device performance can be remotely monitored and controlled via the tracker 190. The analysis engine can use AI and neural networks to generate response strategies to mitigate paying demand surcharges by using forecasted power demand and detected anomalies.

The tracker 190 can also provide remote control or customization of response strategies via network 102 connectivity to the local power system 101. In an example implementation, sensors may be clipped onto circuit breakers, networked together and wired into an independent communication interface. Data from the sensors may be streamed to cloud-based software for analysis that is coupled with weather and electricity pricing data from utilities or alternative energy resources (e.g., solar cells, on-site batteries, etc.). The system can alert building managers (e.g., users) when the facilities are using large amounts of electricity during high demand and identify devices to mitigate the demand. For example, adjusting heating and cooling systems based on current weather data, utility power pricing, building performance forecasts, etc.

By analyzing continuous stream of energy data, using the data collector 120 coupled to the local power system 101, the tracker 190 drives smarter and more responsive building operations, which reduce energy costs. Sensors can wirelessly stream millions of samples per second from a location's electrical panel into the cloud. The tracker 190 provides optimized building controls with predictive future performance by allowing users to control critical energy usage.

For example, the data collector 120 can be compatible with legacy power systems and include a built-in native LTE connectivity to transmit power data collected from sensors attached to the local power system. This sensor can be an always-on secure network for real time remote diagnosis of equipment faults and other energy signature anomalies. The system 100 can also include increased edge-processing and storage as well as improved internal diagnostics.

The tracker 190 may proactively provide predictive building performance reports that are based on accurate forecasts of utility, weather, and energy data. During critical periods of energy use, the tracker 190 suggests response strategies for specific electrical equipment to be adjusted that manage the electric consumption.

Figure 2:
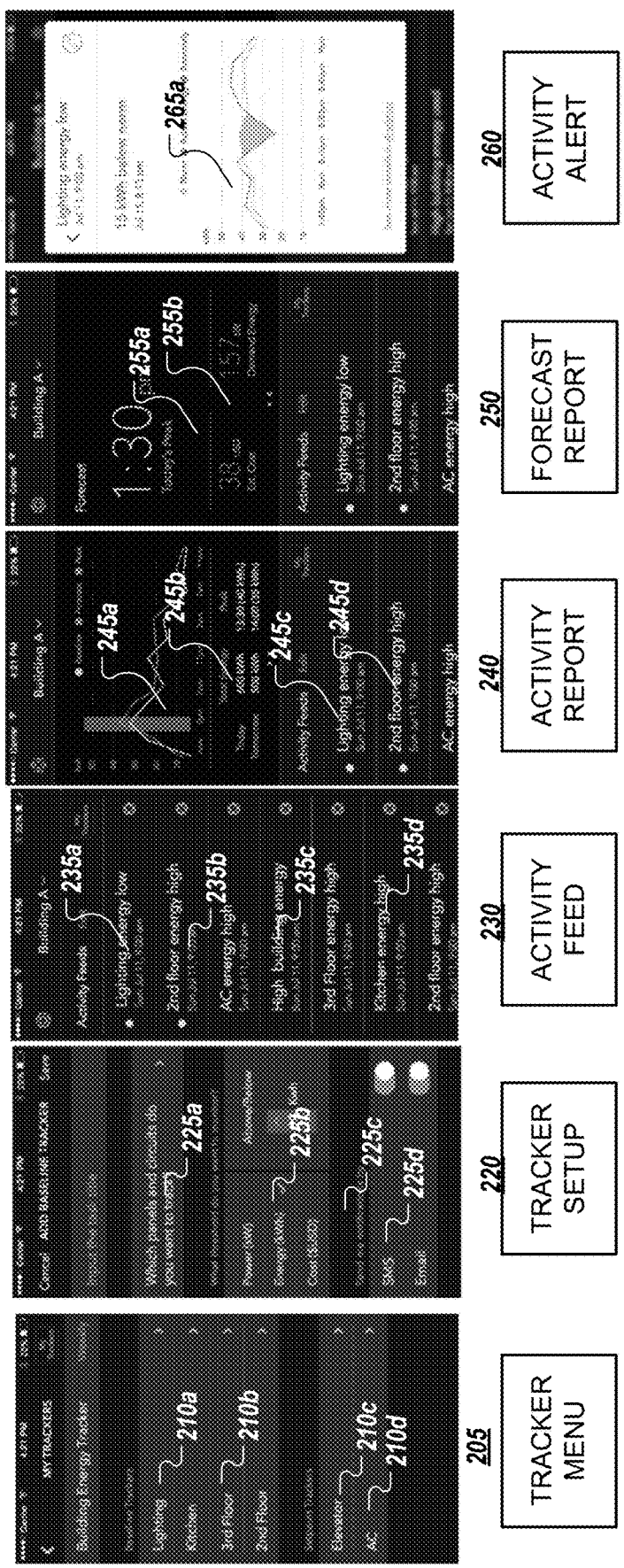
FIG. 2 illustrates a sequence of User interfaces (UI) for tracking and controlling a building energy usage, in accordance with an example implementation.

FIG. 2 illustrates a sequence of User interfaces (UI) 205/220/230/240/250/260 for tracking and controlling a building's energy usage in accordance with an example implementation. The UIs 205/220/230/240/250/260 may be displayed on a display screen of a computing device running the tracker application, such as computing device 905 of FIG. 9 discussed below. The tracker application providing the UIs 205/220/230/240/250/260 can provide real-time performance data for devices attached to the low power system. In an example implementation, the tracker application can include a tracker menu 205 for configuring and navigating the various sensor controls 210a-210d reporting functions provided by the tracker application and associated location of a tracker (e.g., lighting control, AC, elevator, etc.).

The tracker set up interface 220 allows users to configure device monitoring and alert setting using controls 225a-225d. The activity feed interface 230 provides fields 235a-235d providing real time alerts and performance changes for the traced devices.

The activity report interface 240 includes detailed graphical depictions 245a, 245b of historical performances as well as comparisons with similar devices. The activity report interface 240 may also include energy cost information and highlights peak usage periods 245c, 245d.

The forecast report interface 250 provides the user with power usage forecasts 255a, 255b that specify times locations and devices will potentially require power during peak demand periods and result in peak usage surcharges.

The activity alert interface 260 can be configured to notify the user via the screen alert 265a, application or email, of an anomaly or fault of a device powered by the local power system. The user can configure specific custom alerts using the tracker set up interface 220 that provide device performance reports via the activity alert interface 260 based on the user's specific settings and configurations.

Figure 3:
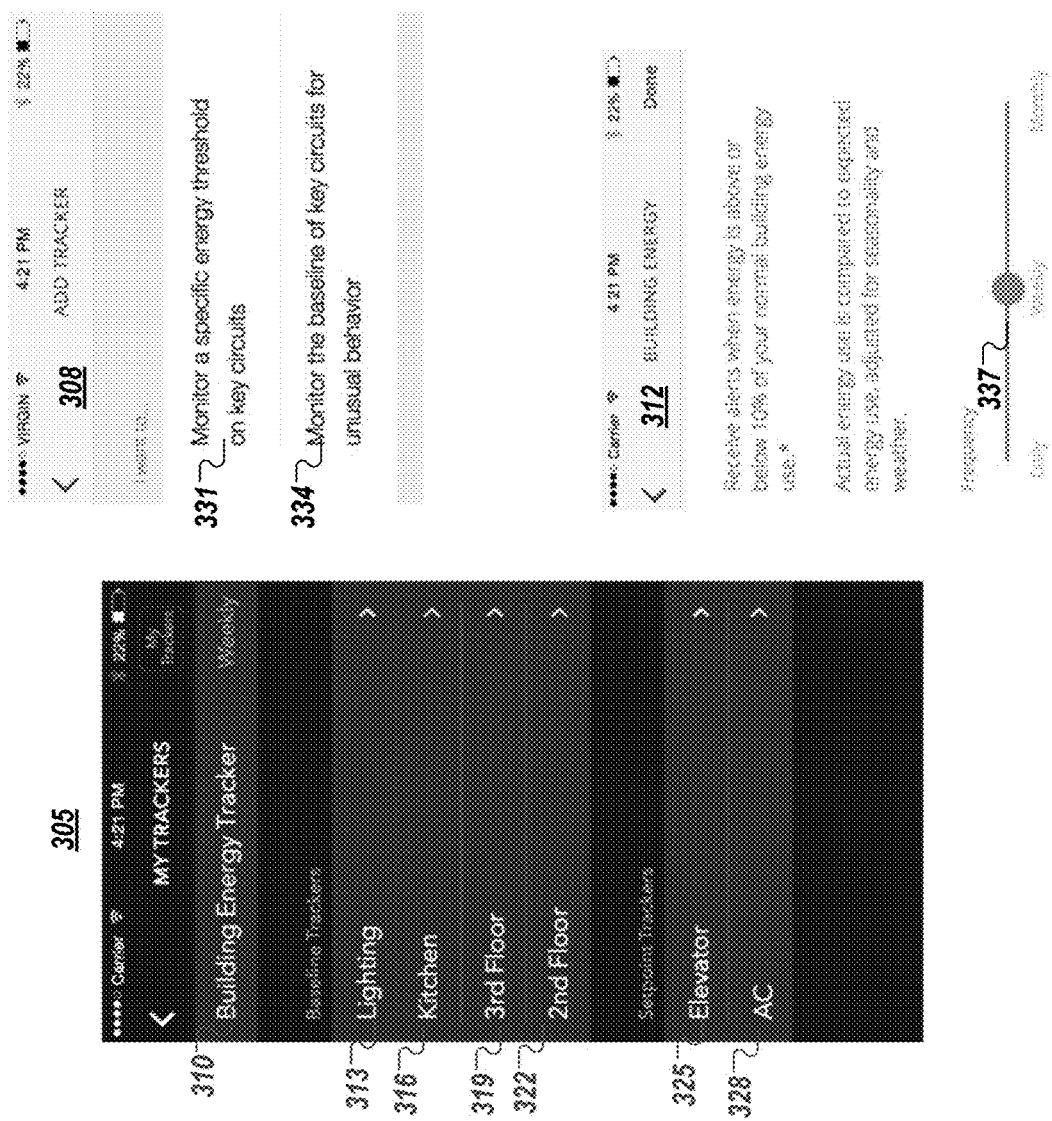
FIG. 3 illustrates a sequence of UIs for an example tracker menu in accordance with an example implementation.

FIG. 3 illustrates a sequence of UIs 305/308/312/314 for an example tracker menu in accordance with an example implementation. UI 305 illustrates the tracker menu interface that provides a control 310 for requesting building energy tracker weekly report and navigation options 313/316/319/322 to see baseline tracking reports that can be reported based on device type or location. The tracker menu interface 305 also includes set point tracking controls 325, 328 for configurable devices such as an elevator system or HVAC system.

UI 308 allows trackers can be added by providing control 331 to monitor specific energy thresholds on a key circuit and control 334 to monitor the baseline of key circuits for unusual behavior.

UI 312 allows the user to specify a frequency to receive alerts when energy is above or below a threshold of the normal energy building use using control 337. The actual energy use may be compared to expected energy use that can be adjusted for seasonality and others from external sources.

UI 314 allows the user to configure controls 340-355 to generate alerts for circuit anomalies by naming the alert and indicating the panels and/or circuits to track with a threshold configuration.

Figure 4:
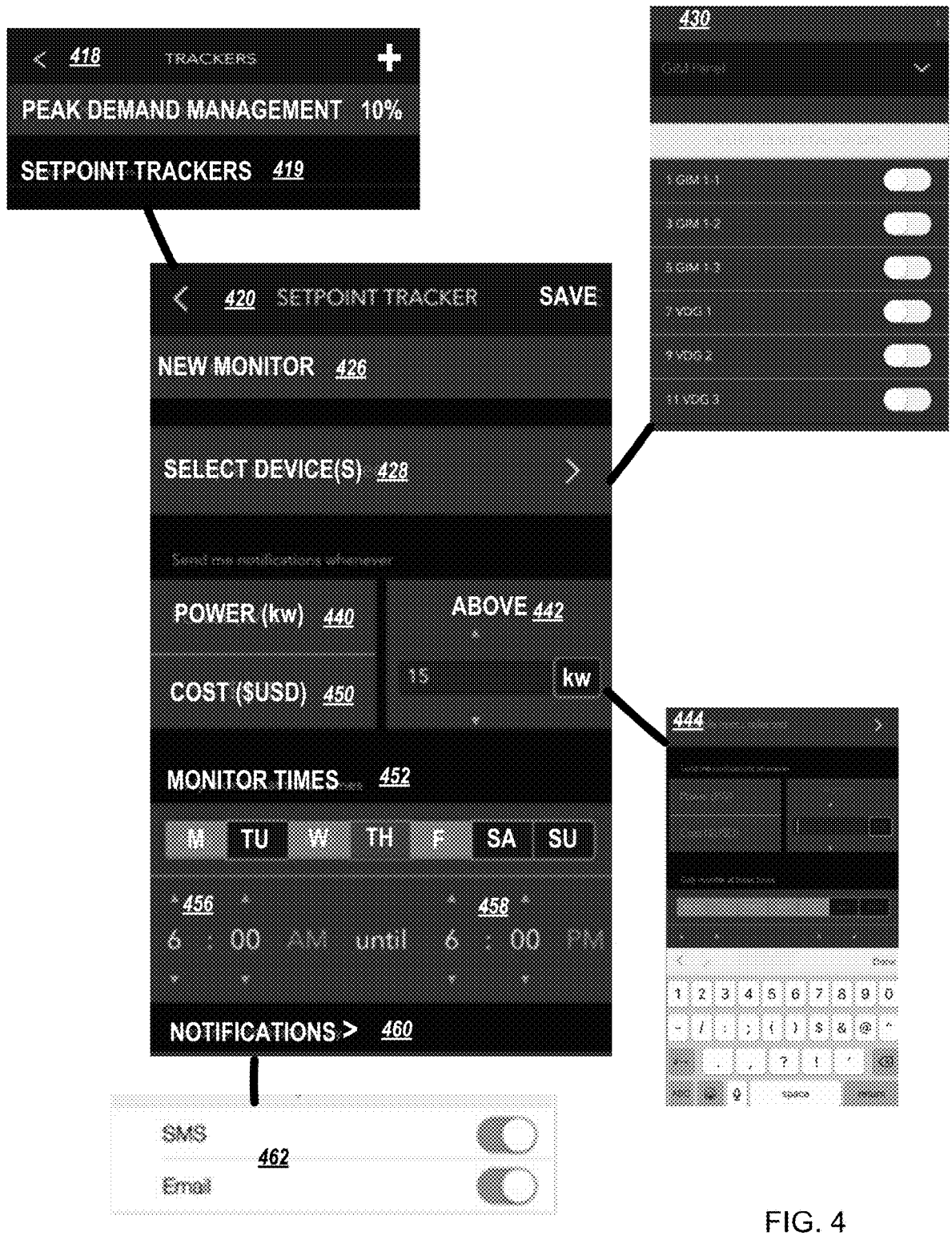
FIG. 4 illustrates a sequence of UIs for an example configuration menu in accordance with an example implementation.

FIG. 4 illustrates a sequence of UIs for an example configuration of a set point tracker 420. With control 426, the user can name the monitor or alert to be programmed and select the device or devices using control 428 to be included in the alerts. Submenu 430 may be provided to the user to select the device or devices to be included in the set point tracker as part of control 428.

Control 442 may allow the user to specify the threshold 442 for notifications based on power (using control 440), costs (using control 450), and/or time. Submenu 444 may be used to define units and allow text entry of threshold values. Region 452 allows the user to configure times and dates to monitor the set points using controls 456, 458. For example, the user can select to be alerted during specific days such as Monday, Wednesday and Friday between the hours of 6 AM and 6 PM when the air conditioner usage passes a threshold power or cost. Control 460 may activate submenu 462 that allows the user to configure various means of notification such as via text, email or application alert.

Figure 5:
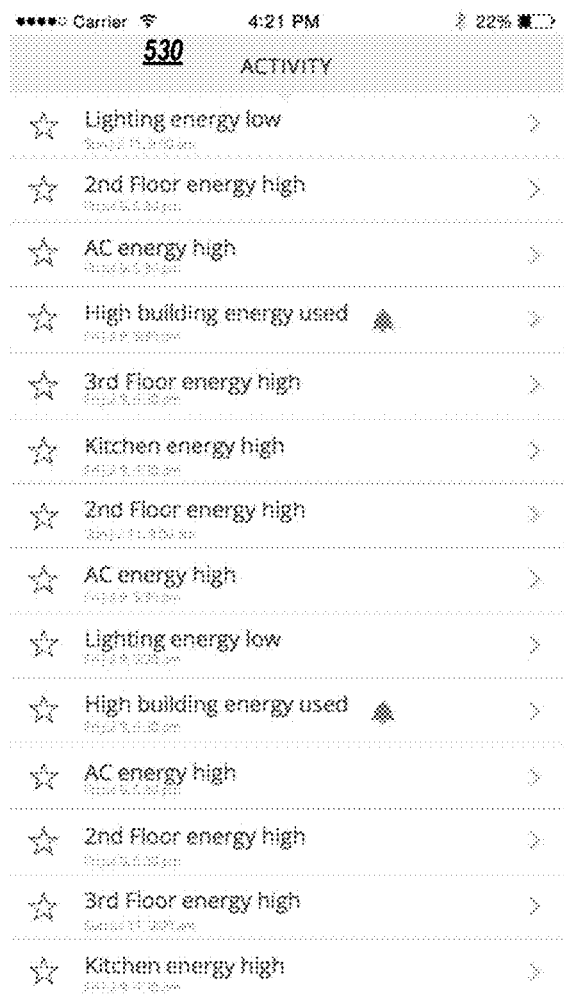
FIG. 5 illustrates a sequence of UIs for an example activity feed monitor in accordance with an example implementation.
Figure 5:
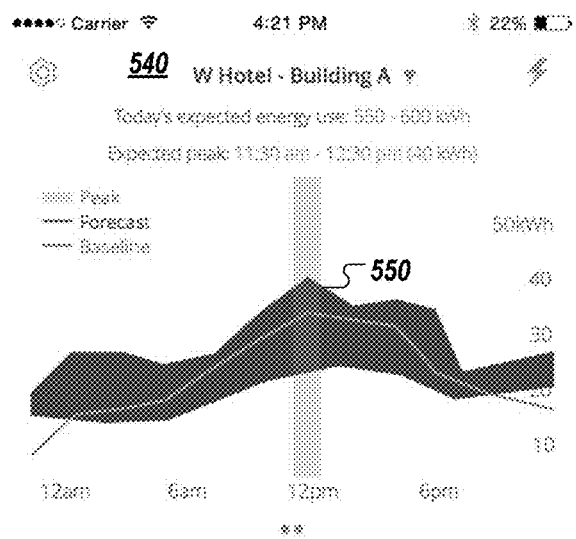
Figure 5:
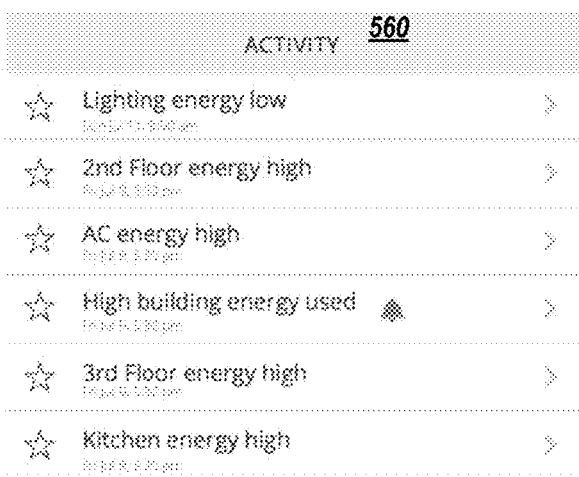

FIG. 5 illustrates a sequence of UIs 530/540 for an example activity feed monitor in accordance with an example implementation. The UI 530 provides a menu of devices of circuits being monitored. UI 540 provides an example of an activity monitor feed visualization that provides the user with real time running updates of each monitored device's performance. UI 540 interface can include a graph 550 of updated information depicting when energy usage and a running list 560 of events based on device or room, for example, lighting energy is low, the second floor energy is high, the overall building energy usage is high, etc.

Figure 6:
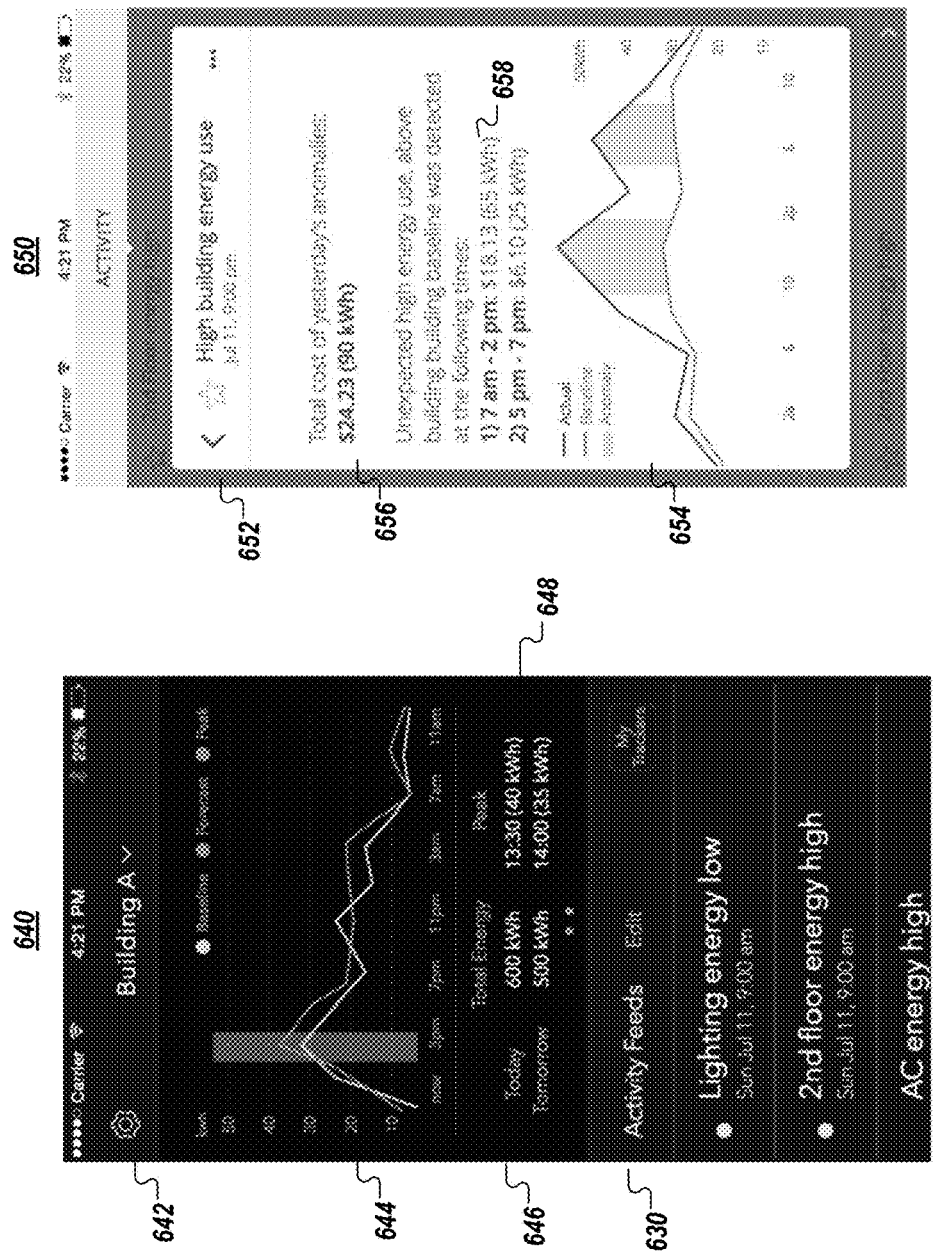
FIG. 6 illustrates a sequence of UIs for an example activity report display in accordance with an example implementation.

FIG. 6 illustrates a sequence of UIs 640/650 for an example activity report display in accordance with an example implementation. The example activity report UI 640 includes selectable devices, rooms, or buildings to review at control 642. The detailed graphical reports at 644 show total energy usage and field 646 may show peak energy usage in real time as well as forecasted total energy usage and peak energy usage for the next day. The user can navigate between detailed graphical reports via the activity feed control 630.

An anomaly report interface 650 can include additional information at field 652 to alert the user based on machine-learning and pattern analysis. For example, in response to an anomaly, the anomaly report interface 650 can provide a total energy cost or unexpected high energy use 656 with graphical tracking 654 showing the actual usage, baseline usage, and anomaly performance.

Figure 7:
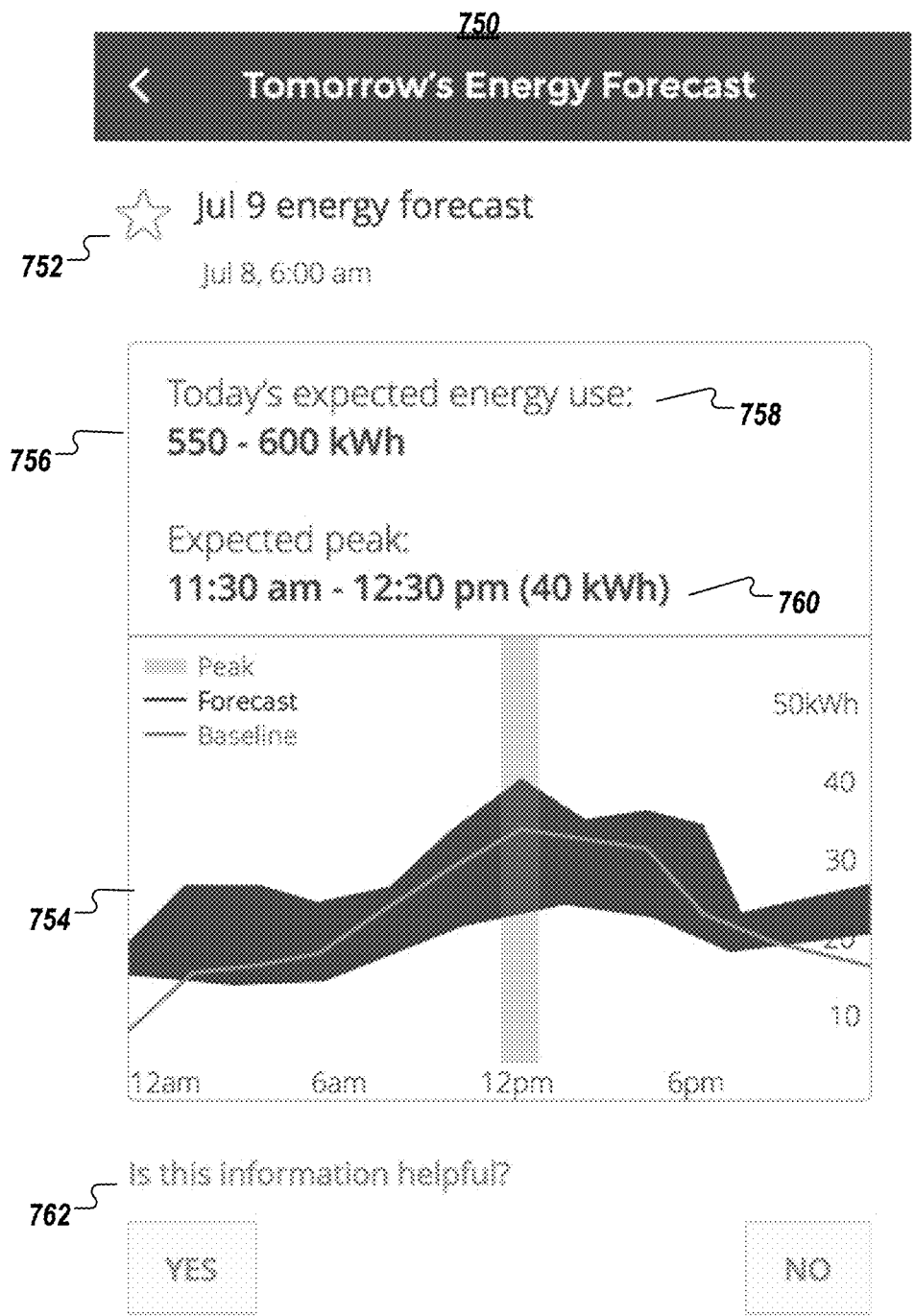
FIG. 7 illustrates an example forecast UI in accordance with an example implementation.

FIG. 7 illustrates an example forecast UI 750 in accordance with an example implementation. The forecast UI 750 may provide region 756 that provides the user with the real time energy usage at field 758 that may be compared to the expected peak usage at field 760. The forecast report 750 can include a graphical depiction 754 of the peak usage time period, forecasted performance, and historical baseline performance. The forecast UI 750 may also provide control area 762 to allow a user to provide feedback.

Figure 8:
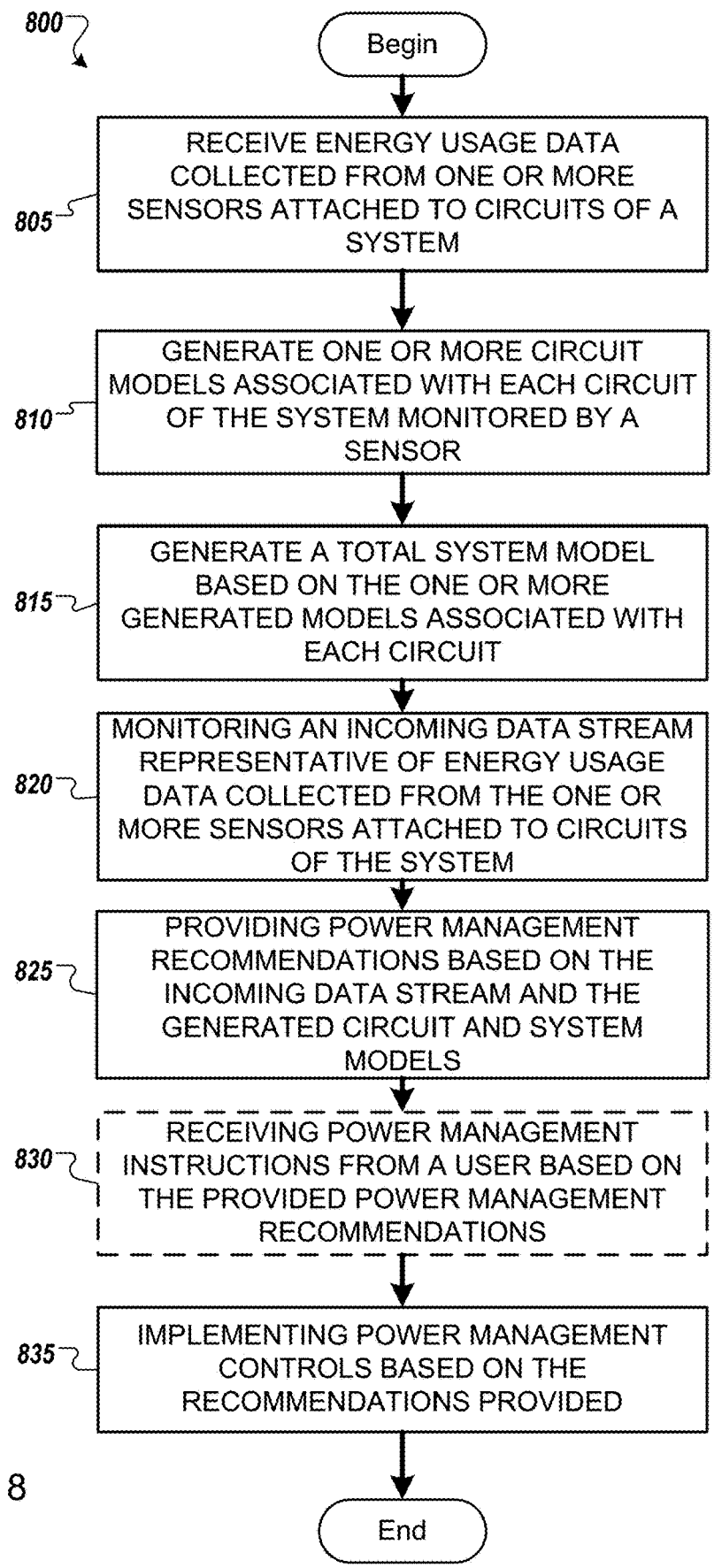
FIG. 8 illustrates a flow chart of a process of power monitoring and management in accordance with an example implementation of the present application.

FIG. 8 illustrates a flow chart of a process 800 of power monitoring and management in accordance with an example implementation of the present application. The process 800 may be performed by a computing device, such as computing device 905 illustrated in FIG. 9 discussed below. When performing the process 800, the computing device may be controlled by an application or mobile app running on the computing device, such as the tracker application described above.

At 805, the computing device may receive energy usage data collected from one or more sensors attached to circuits of a power distribution system. The power distribution system may be a building-based or local, such as power distribution system 101 illustrated in FIG. 1 and discussed above. Each of the sensors providing the energy usage data may be attached to one of the individual circuits or devices connected to the power distribution system. The sensors may be connected to the individual circuits at a distribution panel or circuit breaker panel of the power management system. The computing device may be functioning as a data collector such, as data collector 120, illustrated in FIG. 1 discussed above.

At 810, the computing device may generate one or more circuit models associated with each circuit of the system monitored by a sensor. In some example implementations, the one or more circuit models may be generated automatically, without user input or feedback. Each circuit model may be generated based on the received energy usage data associated with the specific circuit being monitored as well as other data associated with the system and its surrounding environment. For example, the other data may include weather data of the area surrounding the local power system or building power system, calendar data identifying dates and times, usage information associated with the local power system or building power system (e.g., what activities occur within the building and on what schedule they occur), user activities or work schedules within the building, user environment preferences, and/or real time energy pricing data. In some example implementations, the generating of the one or more circuit models may include correlating this other data to the received energy usage data of individual circuits and identifying patterns or recurring events of usage using machine learning or artificial intelligence programming.

Further in some example implementations, the computing device may learn the behavior of a circuit through various means including but not limited to statistical boundaries at competence intervals, hidden mark-off models, finite state machines or any other machine learned modeling of activation and energy consumption behaviors on the circuit.

At 815, the computing device may generate a system or building model based on the one or more generated models associated with each circuit of the system or building. In some example implementations, the system or building model may be generated automatically, without user input or feedback. Again, generating the system or building model may take into consideration other data associated with the system and its surrounding environments. This other data may include weather data of the area surrounding the local power system or building power system, calendar data identifying dates and times, usage information associated with the local power system or building power system (e.g., what activities occur within the building and on what schedule they occur), user activities or work schedules within the building, user environment preferences, and/or real time energy pricing data. In some example implementations, the generating of total system or building level model may include correlating a plurality of circuit level models with this other data and identifying patterns or recurring events of usage using machine learning or artificial intelligence programming.

Again, in some example implementations, the computing device may learn the behavior of a circuit through various means including but not limited to statistical boundaries at competence intervals, hidden mark-off models, finite state machines or any other machine learned modeling of activation and energy consumption behaviors on the circuit.

Further, at 820 the computing device may monitor an incoming data stream representative of energy usage data collected from the one or more sensors attached to the circuits of the system in real time. This may be high-performance data collection collecting hundreds or thousands of samples per second to provide a highly detailed data stream of energy usage associated with the individual circuits of the system in real time.

Based on the incoming data stream, the total system model, and the one or more individual circuit models, the computing device may provide power management recommendations at 825. In some example implementations, providing power management recommendations may include detecting anomalies or outliers of energy usage in the incoming data stream (e.g., high power usage, or abnormal power usage) and providing a recommendation to drive the power usage back into sustainable levels. For example, the incoming data stream may be compared with the total system model, one or more of the individual circuit models, or both in order to detect faults in individual circuits or the entire system.

In some example implementations, providing power management recommendations may also include providing power usage alerts through the application as described above.

At 830, the computing device may optionally receive power management instructions from a user monitoring the power system using the application. These power management instructions may include confirmation for the computing device to proceed as recommended, may include instructions to take no action, or may include instructions to take alternative action. For example, a user may override a recommendation to shut down an HVAC system and provide an alternative action that should be taken in response to the detected anomaly. In such example implementations, the alternative action or other user response may be incorporated into the total system model and/or the one or more individual circuit models to be used to make additional recommendations or alternative recommendations in the future based on recognition of user's preferences.

At 835, the computing device may automatically implement power management controls based on the recommendations previously provided by the computing device. In some example implementations, if a contrary user instruction is received, the computing device may instead implement the user instructions automatically or may take some third action selected based on a combination of the recommended action, the user instruction, and other incoming data being received by the computing device. After the computing device implements power management controls the process 800 may end. Process 800 may be repeated on a regular basis by the computing device autonomously.

Figure 9:
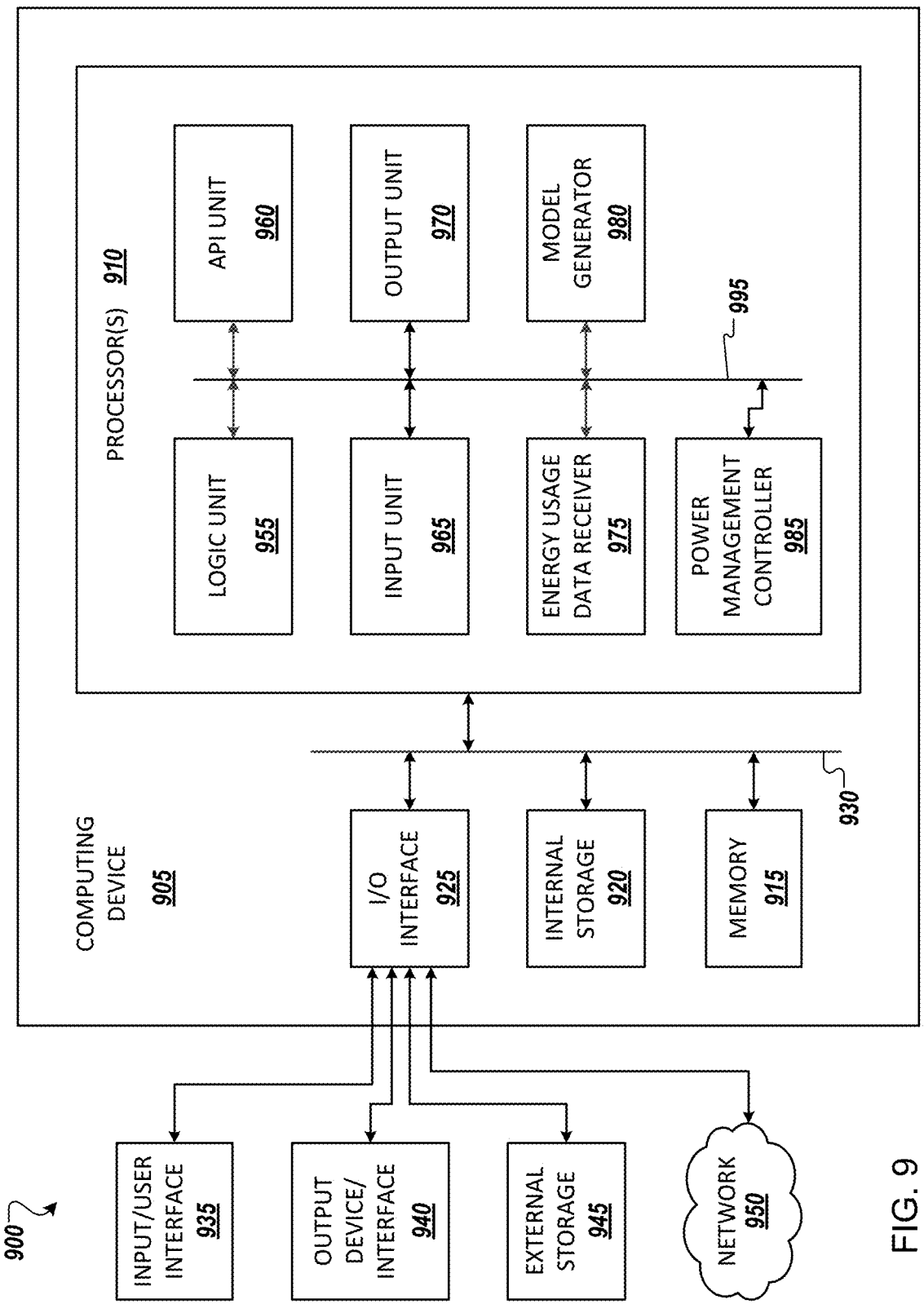
FIG. 9 illustrates an example computing environment with an example computer device suitable for use in some example implementations of the present application.

FIG. 9 illustrates an example computing environment 900 with an example computer device 905 suitable for use in some example implementations. Computing device 905 in computing environment 900 can include one or more processing units, cores, or processors 910, memory 915 (e.g., RAM, ROM, and/or the like), internal storage 920 (e.g., magnetic, optical, solid state storage, and/or organic), and/or I/O interface 925, any of which can be coupled on a communication mechanism or bus 930 for communicating information or embedded in the computing device 905.

Computing device 905 can be communicatively coupled to input/interface 935 and output device/interface 940. Either one or both of input/interface 935 and output device/interface 940 can be a wired or wireless interface and can be detachable. Input/interface 935 may include any device, component, sensor, or interface, physical or virtual, which can be used to provide input (e.g., buttons, touch-screen interface, keyboard, a pointing/cursor control, microphone, camera, braille, motion sensor, optical reader, and/or the like).

Output device/interface 940 may include a display, television, monitor, printer, speaker, braille, or the like. In some example implementations, input/interface 935 (e.g., user interface) and output device/interface 940 can be embedded with, or physically coupled to, the computing device 905. In other example implementations, other computing devices may function as, or provide the functions of, an input/interface 935 and output device/interface 940 for a computing device 905. These elements may include, but are not limited to, well-known AR (i.e., augmented reality) hardware inputs so as to permit a user to interact with an AR environment.

Examples of computing device 905 may include, but are not limited to, highly mobile devices (e.g., smartphones, devices in vehicles and other machines, devices carried by humans and animals, and the like), mobile devices (e.g., tablets, notebooks, laptops, personal computers, portable televisions, radios, and the like), and devices not designed for mobility (e.g., desktop computers, server devices, other computers, information kiosks, televisions with one or more processors embedded therein and/or coupled thereto, radios, and the like).

Computing device 905 can be communicatively coupled (e.g., via I/O interface 925) to external storage 945 and network 950 for communicating with any number of networked components, devices, and systems, including one or more computing devices of the same or different configuration. Computing device 905 or any connected computing device can be functioning as, providing services of, or referred to as a server, client, thin server, general machine, special-purpose machine, or another label.

I/O interface 925 can include, but is not limited to, wired and/or wireless interfaces using any communication or I/O protocols or standards (e.g., Ethernet, 802.11xs, Universal System Bus, WiMAX, modem, a cellular network protocol, and the like) for communicating information to and/or from at least all the connected components, devices, and networks in computing environment 900. Network 950 can be any network or combination of networks (e.g., the Internet, local area network, wide area network, a telephonic network, a cellular network, satellite network, and the like).

Computing device 905 can use and/or communicate using computer-usable or computer-readable media, including transitory media and non-transitory media. Transitory media includes transmission media (e.g., metal cables, fiber optics), signals, carrier waves, and the like. Non-transitory media includes magnetic media (e.g., disks and tapes), optical media (e.g., CD ROM, digital video disks, Blu-ray disks), solid state media (e.g., RAM, ROM, flash memory, solid-state storage), and other non-volatile storage or memory.

Computing device 905 can be used to implement techniques, methods, applications, processes, or computer-executable instructions in some example computing environments. Computer-executable instructions can be retrieved from transitory media, and stored on and retrieved from non-transitory media. The executable instructions can originate from one or more of any programming, scripting, and machine languages (e.g., C, C++, C #, Java, Visual Basic, Python, Perl, JavaScript, and others).

Processor(s) 910 can execute under any operating system (OS) (not shown), in a native or virtual environment. One or more applications can be deployed that include logic unit 955, application programming interface (API) unit 960, input unit 965, output unit 970, energy usage data receiver unit 975, model generator unit 980, and power management controller unit 985, and inter-unit communication mechanism 995 for the different units to communicate with each other, with the OS, and with other applications (not shown).

For example, energy usage data receiver unit 975, model generator unit 980, and power management controller unit 985 may implement one or more processes shown in FIG. 8 and may be controlled via the user interfaces illustrated in FIGS. 2-7. The described units and elements can be varied in design, function, configuration, or implementation and are not limited to the descriptions provided.

In some example implementations, when information or an execution instruction is received by API unit 960, it may be communicated to one or more other units (e.g., energy usage data receiver unit 975, model generator unit 980, and power management controller unit 985). For example, the energy usage data receiver unit 975 may receive energy usage data from one or more sensors coupled to individual circuits of a local power system such as a building power distribution system and provide the received energy usage data to the model generator unit 980. The model generator unit 980 may generate individual circuit models and a total system or building model based on the received energy usage data and other data as described above with respect to FIG. 8. The model generator unit 980 may provide the generated models to the power management controller unit 985. The energy usage data receiver unit 975 may also receive a live stream of real time energy usage data and provide to the power management controller unit 985.

The power management controller unit 985 may determine power management recommendations to control power usage based on the received real time energy usage data and the generated models and provide the determined power management recommendations to a user via output unit 970. Additionally, the power management controller unit 985 may also receive user instructions in response to the determined power management recommendations and implement power management controls based on the received instructions. In some example implementations the power management controller 985 may directly implement power management controls without providing recommendations to a user.

In some instances, the logic unit 955 may be configured to control the information flow among the units and direct the services provided by API unit 960, input unit 965, energy usage data receiver unit 975, model generator unit 980, and power management controller unit 985 in some example implementations described above. For example, the flow of one or more processes or implementations may be controlled by logic unit 955 alone or in conjunction with API unit 960.

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of defined steps leading to a desired end state or result. In example implementations, the steps carried out require physical manipulations of tangible quantities for achieving a tangible result.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to, optical disks, magnetic disks, read-only memories, random access memories, solid state devices and drives, or any other type of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It can be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

Moreover, other implementations of the present application may be apparent to those skilled in the art from consideration of the specification and practice of the teachings of the present application. Various aspects and/or components of the described example implementations may be used singly or in any combination. It is intended that the specification and example implementations be considered as examples only, with the true scope and spirit of the present application being indicated by the following claims.

The invention claimed is:
1. A building management system, comprising:
a local power system that delivers to power to devices at a location;
a data collector system coupled to the local power system, to monitor aggregate power used at a location, including at least one circuit based sensor configured to collect power usage data, each of the at least one sensors being clamped onto a circuit being, and a data transmitter coupled to the at least one sensor and communicating the collected power usage data over a network to a cloud analyzer system;
a tracker configured to provide real-time reporting, alerts, and control via the network, and to be executed by a processor in an operating system (OS), in a native or virtual environment, wherein the tracker interacts with an analysis engine to map out energy use inside of a building on an individual circuit basis, and wherein the data collector system comprises a plurality of circuit based sensors, each of the plurality of sensors being clamped to a separate circuit of the local power system and communicating collected power usage data from each clamped separate circuit to the data transmitter, which provides the data over a network to the cloud analyzer system, and further wherein the at least one sensors samples power usage information associated with each of the devices, the power usage information comprising a frequency of a power draw signal, to categorize a type of each of the devices.

2. The system of claim 1, wherein a first sensor of the plurality of circuit based sensor is directly coupled to data transmitter by a signal cable.

3. The system of claim 2, wherein a second sensor of the plurality of the circuit based sensors is directly coupled to first sensor by a signal cable, wherein the second sensor is indirectly connected to the data transmitter by the first sensor.

4. The system of claim 1, wherein the data collector system is coupled to the local power system at a distribution panel of the local power system, wherein the at least one circuit based sensor is coupled to the circuit at the distribution panel.

5. The system of claim 1, wherein the tracker interacts with the analysis engine that maps out energy use inside of a building on a system-by-system, appliance-by-appliance level, using a minimal number of sensors located at a central collection point, so that the tracker can also provide remote control or customization of response strategies via network connectivity to the local power system.

6. The building management system of claim 1, wherein the at least one circuit-based sensor is used for super-high-frequency disaggregation at 8 kilohertz, and the tracker is configured so that user can set a rule to generate an alert when electrical consumption does not exceed an amount of carbon during daylight.

7. The building management system of claim 1, wherein the tracker is configured so that user can set a rule to generate an alert when electrical consumption does not exceed an amount of carbon during daylight.

8. A method of managing power in a local power system, the method comprising:
   receiving, by an energy management system, energy usage data collected from a plurality of sensors attached to individual circuits of the local power system;
   generating an individual circuit model for each individual circuit associated with each of the plurality of sensors based on the received energy usage data;
   monitoring an incoming data stream representative of energy usage data collected from the plurality of sensors;
   comparing the incoming data stream to the generated individual circuit model; and
   implementing, by the energy management system, power management controls on one or more of the individual circuits based on the generated individual circuit model and the monitored incoming data stream,
   wherein the implementing power management controls comprises:
   providing power management recommendations based on the generated individual circuit model and the monitored incoming data stream;
   receiving power management instructions in response to the provided power management recommendations; and
   implementing the power management recommendations as the power management controls on one or more of the individual circuits based on the received power management instructions comprising an indication of approval,
   wherein the power management controls comprise instructions to take an action, to take no action, or to permit a user to override the power management recommendations in response to a detected anomaly, to allow peak usage to occur, and
   further wherein the power management recommendations comprise generating a preventive maintenance warning based on an electrical signature indicating that a device associates with the electrical signature requires preventive maintenance.

9. The method of claim 8, further comprising, generating a system model based on the generated individual circuit models for each individual circuit.

10. The method of claim 8, wherein the generating the individual circuit model for each individual circuit comprises correlating the received energy usage data with:
   weather data of an area surrounding the local power system;
   data representative of usage activities occurring at the area surrounding the local power system;
   user activities or work schedules of an area surrounding the local power system;
   user environmental preferences; and
   real time energy pricing data.

11. The method of claim 8, wherein generating the individual circuit models for each individual circuit comprises performing machine learning based modeling of activation and energy consumption behaviors on the individual circuits.

12. The method of claim 11, wherein performing machine learning based modeling comprises using:
   statistical boundaries at competence intervals,
   hidden Markov models, and
   finite state machines.

13. The method of claim 8, further comprising updating one or more of:
   at least one individual circuit model and a total system model generated based on the generated individual circuit models for each individual circuit,
   wherein the updating of the one or more of the at least one individual circuit model and the total system model is based on the received power management instructions comprising one of an indication of disapproval and an instruction for alternative power management controls.

14. The method of claim 8, wherein the generating the individual circuit model is performed automatically based on the received energy usage data without user input or feedback.

15. A non-transitory computer readable medium encoding with instructions for causing a computing device to perform a method of managing power in a local power system, the method comprising:
   receiving energy usage data collected from a plurality of sensors attached to individual circuits of the local power system;
   generating an individual circuit model for each individual circuit associated with each of the plurality of sensors based on the received energy usage data;

monitoring an incoming data stream representative of energy usage data collected from the plurality of sensors;

comparing the incoming data stream to the generated individual circuit model; and implementing power management controls on one or more of the individual circuits based on the generated individual circuit model and the monitored incoming data stream, wherein the implementing power management controls comprises:

providing power management recommendations based on the generated individual circuit model and the monitored incoming data stream, so as to detect anomalies or outliers of energy usage in the incoming data stream, and providing an anomaly report interface;

receiving power management instructions in response to the provided power management recommendations; and implementing the power management recommendations as the power management controls on one or more of the individual circuits based on the received power management instructions comprising an indication of approval, the power management recommendations comprising a recommendation to drive the power usage to a sustainable level.

16. The non-transitory computer readable medium of claim 15, further comprising, generating a system model based on the generated individual circuit models for each individual circuit.

17. The non-transitory computer readable medium of claim 15, wherein generating the individual circuit model for each individual circuit comprises correlating the received energy usage data with:

weather data of an area surrounding the local power system;

data representative of usage activities occurring at the area surrounding the local power system;

user activities or work schedules of an area surrounding the local power system;

user environmental preferences; and real time energy pricing data.

18. The non-transitory computer readable medium of claim 15, wherein generating the individual circuit models for each individual circuit comprises performing machine learning based modeling of activation and energy consumption behaviors on the individual circuits, wherein performing machine learning based modeling comprising using:

statistical boundaries at competence intervals, hidden Markov models, and finite state machines.

19. The non-transitory computer readable medium of claim 15, wherein generating the individual circuit model is performed automatically based on the received energy usage data without user input or feedback.

* * * * *